(12) United States Patent
Cantatore et al.

(10) Patent No.: US 7,381,908 B1
(45) Date of Patent: Jun. 3, 2008

(54) CIRCUIT BOARD STIFFENER

(76) Inventors: Cosimo Cantatore, 310 E. Dunne Ave., Murphy Ranch Apt. 204, Morgan Hill, CA (US) 95037; Mohsen H Mardi, P.O. Box 1724, San Jose, CA (US) 95109; David M Mahoney, 6092 Monterey Hwy. #308, San Jose, CA (US) 95138

( * ) Notice: Subject to any disclaimer, the term of this patent is extended or adjusted under 35 U.S.C. 154(b) by 70 days.

(21) Appl. No.: 11/176,903

(22) Filed: Jul. 7, 2005

(51) Int. Cl.
*H05K 7/02* (2006.01)
*G01R 31/02* (2006.01)

(52) U.S. Cl. .................. 174/541; 174/535; 324/755
(58) Field of Classification Search ............ 361/752; 174/535, 541; 324/755
See application file for complete search history.

(56) References Cited

U.S. PATENT DOCUMENTS

| | | | |
|---|---|---|---|
| 6,362,968 B1 * | 3/2002 | Lajara et al. | 361/752 |
| 6,512,678 B2 * | 1/2003 | Sims et al. | 361/759 |
| 6,771,517 B2 | 8/2004 | Crapisi et al. | |
| 2002/0186002 A1 | 12/2002 | McAllister et al. | |
| 2003/0080763 A1 | 5/2003 | Yu et al. | |
| 2003/0164716 A1 | 9/2003 | Hsieh et al. | |

* cited by examiner

*Primary Examiner*—Hung V Ngo
(74) *Attorney, Agent, or Firm*—Fountainhead Law Group P.C.; Chad R. Walsh

(57) ABSTRACT

Embodiments of the present invention provide improved circuit board stiffeners. In one embodiment the present invention includes a circuit board stiffener comprising a lower stiffener piece having a first lower surface for abutting an upper surface of a test system and a first upper surface, and at least one upper stiffener piece having a second lower surface for abutting the first upper surface of the lower stiffener piece and a second upper surface for attaching to a circuit board.

11 Claims, 15 Drawing Sheets

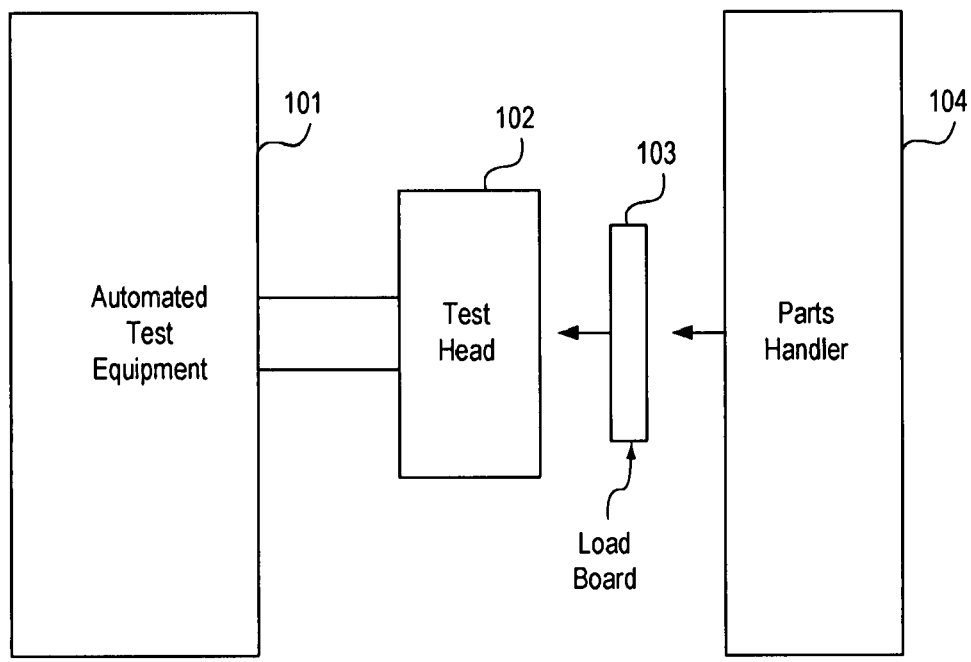
FIG. 1
(Prior Art)
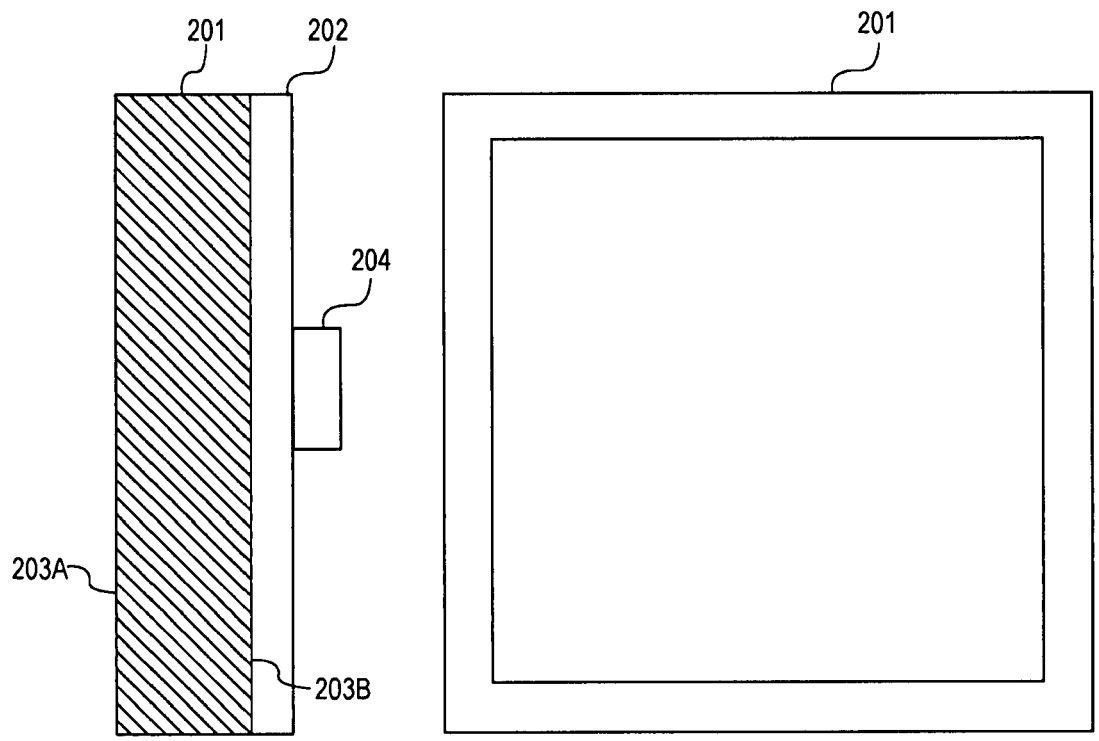
FIG. 2A
(Prior Art)
FIG. 2B
(Prior Art)

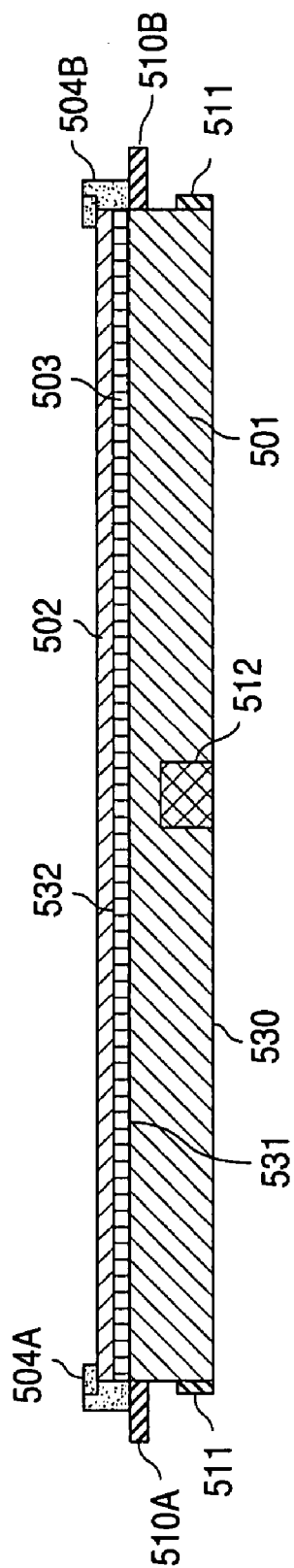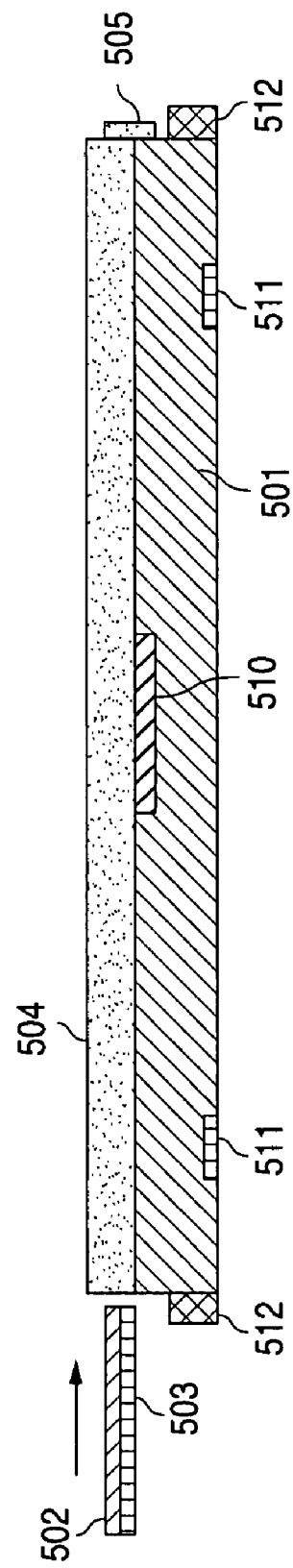

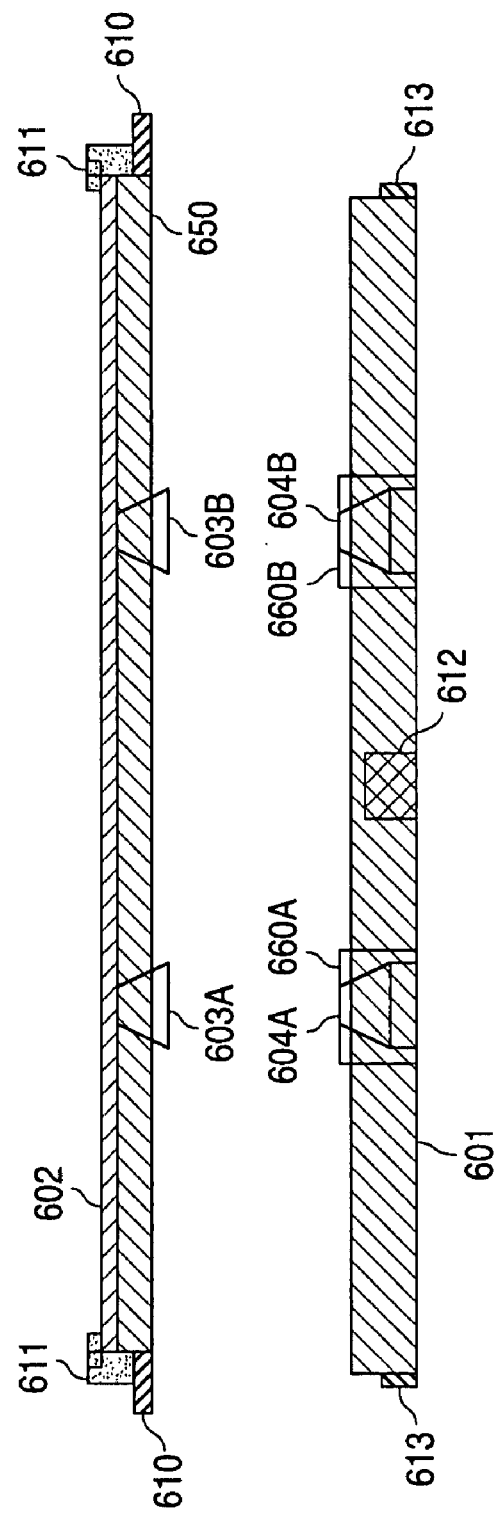
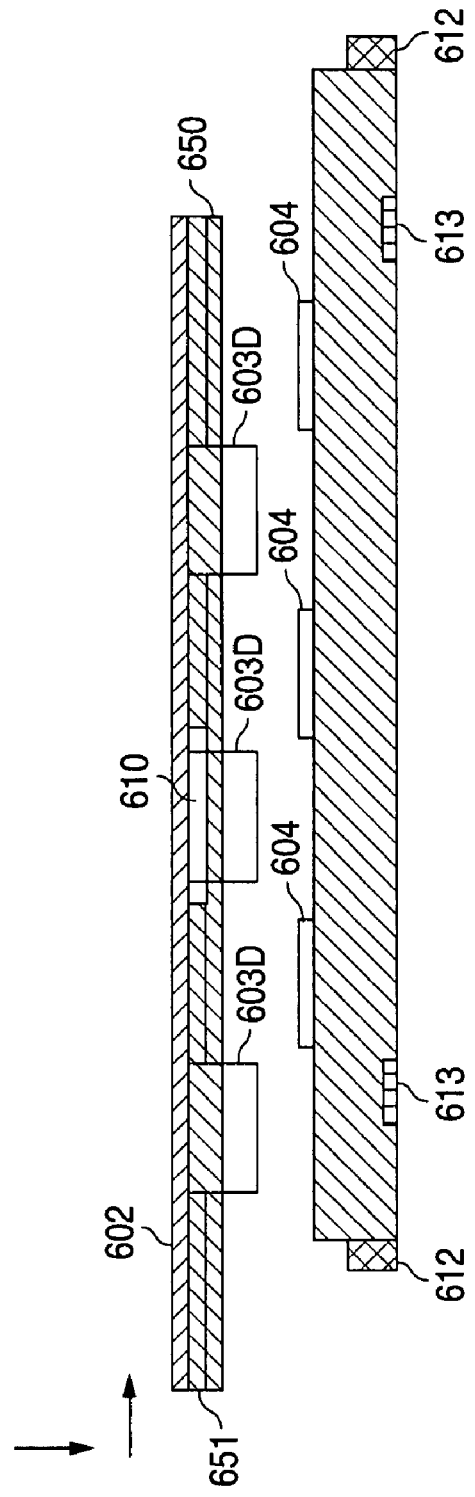
FIG. 6A
FIG. 6B

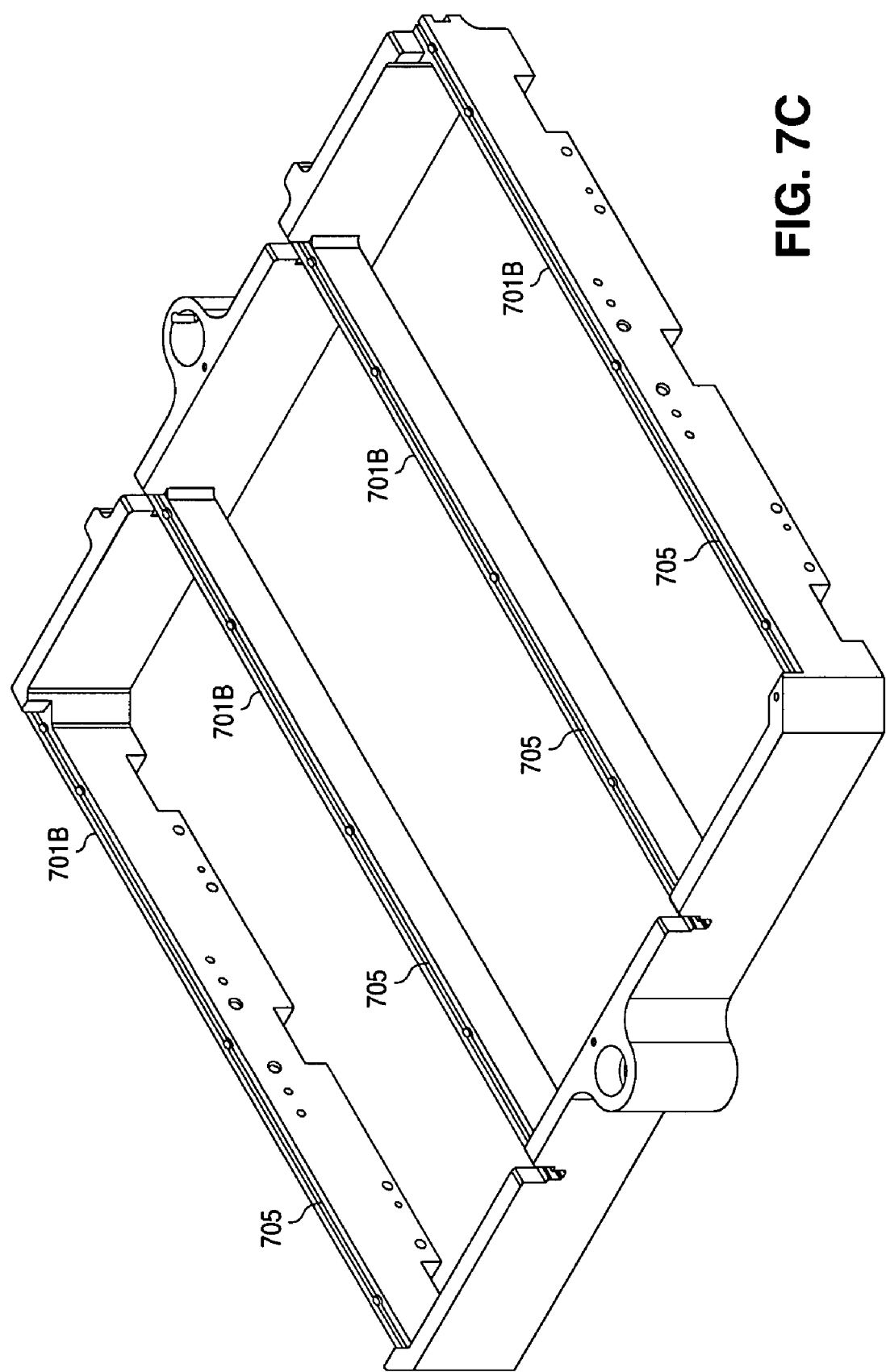

CIRCUIT BOARD STIFFENER

BACKGROUND

The present invention relates to stiffeners, and in particular, to circuit board stiffener that may be used with an automated test system.

Circuit boards are typically used for connecting a variety of electronic devices together to implement a variety of different functions. Typically, different types of integrated circuits (i.e., "ICs"), passive components, or other devices may be mounted on the surface of the circuit board. Circuit boards further include multiple layers to metal or other conductive material for conducting electric current and carrying electrical signals between the devices. Circuit boards are typically manufactured from fiberglass, and therefore, are typically only semi-rigid structures. The electrical devices and components, as well as the electrical connections between them, can be very sensitive to stress or bending when the circuit board is used in a real world application. Many electronic applications attach stiffeners to circuit boards to protect the circuit boards from various physical shocks, disturbances, impacts, or other types of bending or stress. A stiffener is a rigid piece of material that may be used to reinforce and support the circuit board.

FIG. 1 is an example application of a circuit board stiffener. FIG. 1 illustrates an automated test environment including automated test equipment 101 ("ATE") coupled to a test head 102. ATE 101 may be any of a variety of automated testers such as, for example, an integrated circuit tester by Teradyne, Inc.®. Testers typically include electronic systems and resources in the main tester body 101. The resources may be coupled to a test head 102, which may include yet more electronic resources and systems. The resources and systems of the tester may be coupled to a circuit board 103 (sometimes referred to in this application as a "load board") by placing the circuit board in contact with connectors on the test head (not shown). Numerous integrated circuits may be sequentially tested by coupling circuit board 103 to a parts handler 104. Circuit board 103 and parts handler 104 are typically coupled together at a contact point so that one or more integrated circuits in parts handler 104 may be sequentially brought into electrical contact with the circuit board and tested.

Generally, the testing of different integrated circuits requires different circuit boards because the different ICs typically require different tester resources to be properly tested. Thus, in a production environment, circuit boards on a given tester may be interchanged on a regular basis. The process of installing a circuit board on a tester and connecting the handler (sometimes referred to as "docking") can result in severe stress on the circuit board. Moreover, when the handler is operating, individual ICs may be physically forced against the circuit board by motors, actuators or other mechanisms, which may also result in severe shocks and stresses on the circuit board. Thus, it has become common for circuit boards to be provided with a stiffener to provide structural support.

FIGS. 2A and 2B show an example of a circuit board and stiffener that is used in an ATE environment. FIG. 2A shows a side view of the circuit board and stiffener, and FIG. 2B shows a bottom view. Stiffener 201 typically provides peripheral support to circuit board 202 and defines an opening through the center. Tester resources may be coupled to circuit board electronics using connections (e.g., pogo pins, ribbon cables or other types of connectors) that pass through the opening in the stiffener. Circuit board 202 may be attached to stiffener 201 using screws (not shown), for example. Stiffener 201 typically includes a lower surface 203A for abutting to a test system. A variety of mechanisms may be used that allow a user to attach and detach the stiffener to the test system. The upper surface 203B of stiffener 201 may be attached to circuit board 202. In some applications, a contactor 204 such as a edge connectors, for example, may be used to provide electrical connections between the circuit board and ICs in the handler.

FIG. 3 illustrates another stiffener 301 and circuit board 302. As the complexity of integrated circuits grows, correspondingly more complex testers and circuit boards are required to properly test the ICs. For example, modern digital, analog, or mixed signal ICs may include hundreds of device pins, which may require several hundred separate tester resource connections between the tester and the circuit board. Thus, the circuit boards used to test such devices can be very large, and the stiffeners used to support these circuit boards may also be very large. Stiffener 301 is attached (e.g., by screws) to circuit board 302. Stiffener 301 may be constructed from aluminum or other strong rigid material, and thus may become very heavy as the size of the circuit board grows. Two handles 310A and 310B are attached to the outer sidewall of the stiffener to facilitate handling of the circuit board when it is being attached to or removed from the tester and moved around the production facility. Attachment bars 311A and 311B are included to allow the stiffener to engage an attachment mechanism on the tester. Stiffener 301 further includes transverse beams 320 and 321 to add additional support to the stiffener frame. The periphery and transverse beams of the stiffener define openings 350, 351, and 352. As shown in FIG. 4, tester resources, such as channel cards, may be coupled through the openings using spring actuated pogo pin blocks to bring tester resources into contact with the circuit board electronics.

As mentioned above, as integrated circuits become more complex, the circuit boards and stiffeners (together, "load board") used to test them become larger. As the circuit boards become larger, the stiffeners used to support them become heavier. If many different ICs are being tested, a user may be required to attach and detach many load boards to an ATE. The excessive weight of the stiffeners can make interchanging load boards burdensome and difficult. Moreover, these large load boards may take up a lot of space for storage. As mentioned above, each IC product may require a corresponding load board. Additionally, multiple copies of the same load board are typically built so that the same IC product can be tested simultaneously on more than one tester. Thus, in a production environment hundreds or even thousands of load boards must be transported between testers and stored while not in use. To add to these problems, each stiffener may be very expensive. Stiffeners for use in an ATE environment may cost hundreds or even thousands of dollars. It would generally be desirable to reduce to weight, cost, and storage burden of contemporary stiffeners.

Thus, there is a need for improved circuit board stiffeners. The present invention solves these and other problems by providing an improved circuit board stiffener that may be used in automated test environments.

SUMMARY

Embodiments of the present invention provide improved circuit board stiffeners. In one embodiment the present invention includes a circuit board stiffener comprising a lower stiffener piece having a first lower surface for abutting an upper surface of a test system and a first upper surface, and at least one upper stiffener piece having a second lower surface for abutting the first upper surface of the lower stiffener piece and a second upper surface for attaching to a circuit board.

In one embodiment, the lower stiffener piece is locked to the at least one upper stiffener piece.

In one embodiment, the at least one upper stiffener piece comprises a rigid peripheral frame attached to a circuit board and the lower stiffener piece includes one or more elbow pieces attached to the stiffener, wherein the first upper surface and the elbow pieces form one or more slots for receiving the circuit board and upper stiffener piece.

In one embodiment, the lower stiffener piece comprises a plurality of grooves and the at least one upper stiffener piece includes a plurality of support rails that engage the grooves.

In one embodiment, the lower stiffener piece includes a plurality of grooves in the first upper surface and a plurality locking rails, wherein one locking rail is inserted into each of the grooves, and the at least one upper stiffener piece includes a plurality of transverse support rails configured to engage the plurality of locking rails in the lower stiffener piece.

In one embodiment, each locking rail includes a plurality of guides having a first geometric cross-section, and wherein each transverse support rail has a plurality of open regions between a plurality of semi-closed regions, wherein the sidewalls of the semi-closed regions define cross-sectional openings in the shape of the first geometric cross-section for engaging the guides of each locking rail.

In one embodiment, each locking rail moves parallel to the first plane between a locked and unlocked position, wherein in the unlocked position the guides fit vertically into the open regions and in a locked position the guides move laterally into the semi-closed regions.

In one embodiment, the lower stiffener piece includes a rigid peripheral frame.

In one embodiment, the lower stiffener piece includes one or more transverse beams.

In one embodiment, the peripheral frame has a first outer sidewall defining an outer periphery and one or more inner sidewalls defining one or more vertical openings through said stiffener.

In one embodiment, the at least one upper stiffener piece includes rigid peripheral frame configured to contact the rigid peripheral frame of the lower stiffener piece.

In another embodiment, the present invention includes a circuit board stiffener comprising a lower stiffener piece having a rigid peripheral frame defining one or more openings through the stiffener, wherein the frame includes a first lower surface aligned to a test system and a first upper surface, at least one upper stiffener piece having a second upper surface and second lower surface, the second upper surface configured to attach to a circuit board, and in accordance therewith, the upper stiffener piece provides stiffening support for said circuit board, and a locking mechanism for locking the at least one upper stiffener piece to the first upper surface of the lower stiffener piece.

In one embodiment, the locking mechanism comprises a plurality of grooves in the first upper surface of the lower stiffener piece, and a plurality locking rails each having a plurality of guides having a first geometric cross-sections, wherein one locking rail is inserted into each of the grooves, wherein the at least one upper stiffener piece comprises a plurality of support rails, and wherein the second lower surface of each support rail has a plurality of open regions and a plurality of semi-closed region, and wherein the sidewalls of the semi-closed regions define cross-sectional openings in the shape of the first geometric cross-section for engaging the guides of each locking rail.

In one embodiment, each locking rail moves parallel to said circuit board between a locked and unlocked position, wherein in the unlocked position the guides fit vertically into the open regions and in a locked position the guides move laterally into the semi-closed regions.

In one embodiment, the locking mechanism comprises one or more elbow pieces attached to the stiffener, wherein the first upper surface and the elbow pieces form one or more slots for receiving the circuit board and the at least one upper stiffener piece.

In one embodiment, the locking mechanism comprises a plurality of grooves and at least one upper stiffener piece comprises a plurality of support rails, wherein the support rails engage the grooves.

The following detailed description and accompanying drawings provide a better understanding of the nature and advantages of the present invention.

BRIEF DESCRIPTION OF THE DRAWINGS

FIG. 1 is an example application of a circuit board stiffener.

FIGS. 2A and 2B show an example of a circuit board and stiffener that is used in an ATE environment.

FIGS. 5A-C show an example circuit board stiffener according to one embodiment of the present invention.

FIGS. 6A and 6B show an example circuit board stiffener according to another embodiment of the present invention.

FIGS. 7A-C show an example circuit board stiffener according to another embodiment of the present invention.

DETAILED DESCRIPTION

Figure 3:
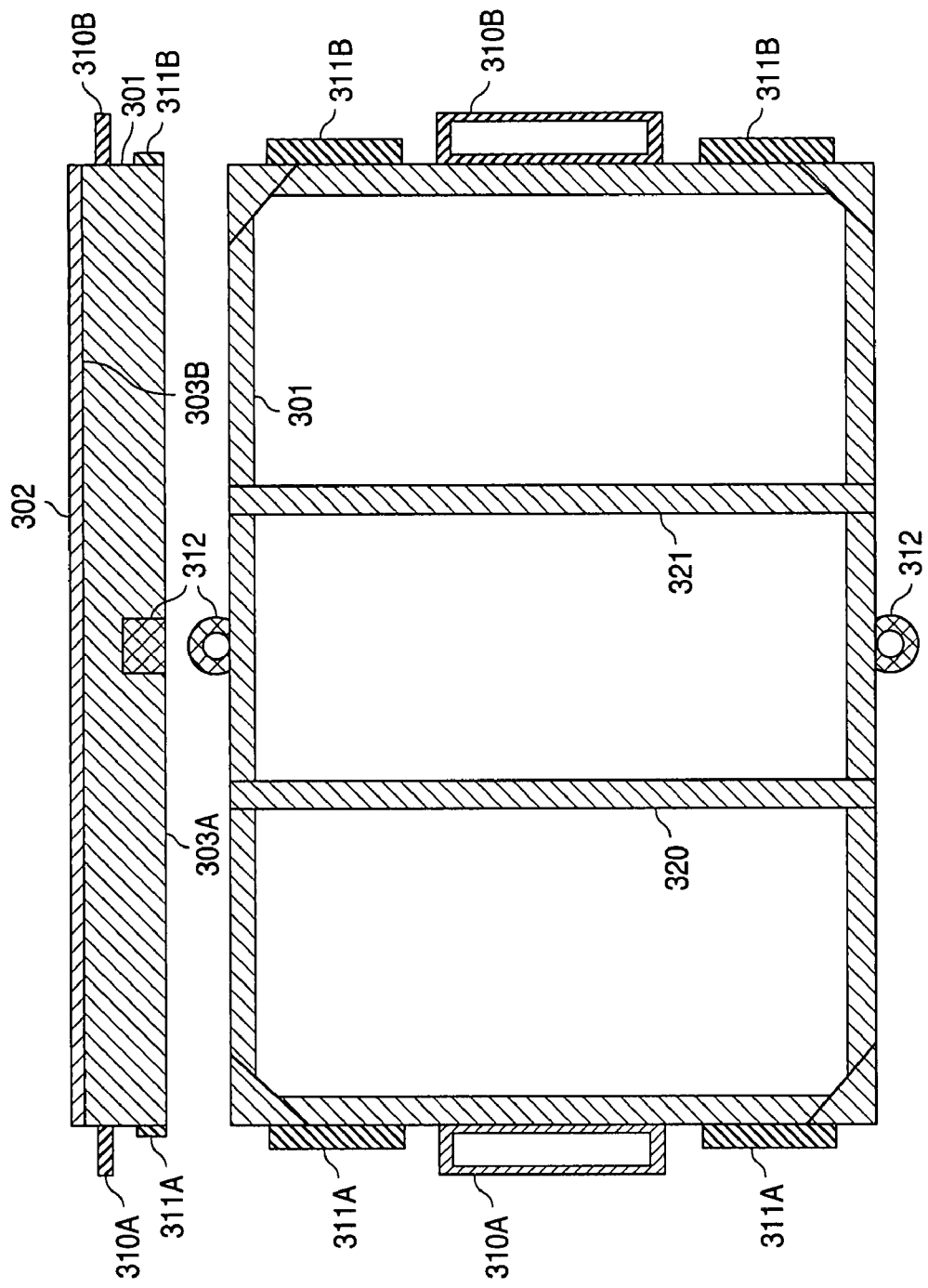
FIG. 3 illustrates another prior art stiffener and circuit board.
Figure 4:
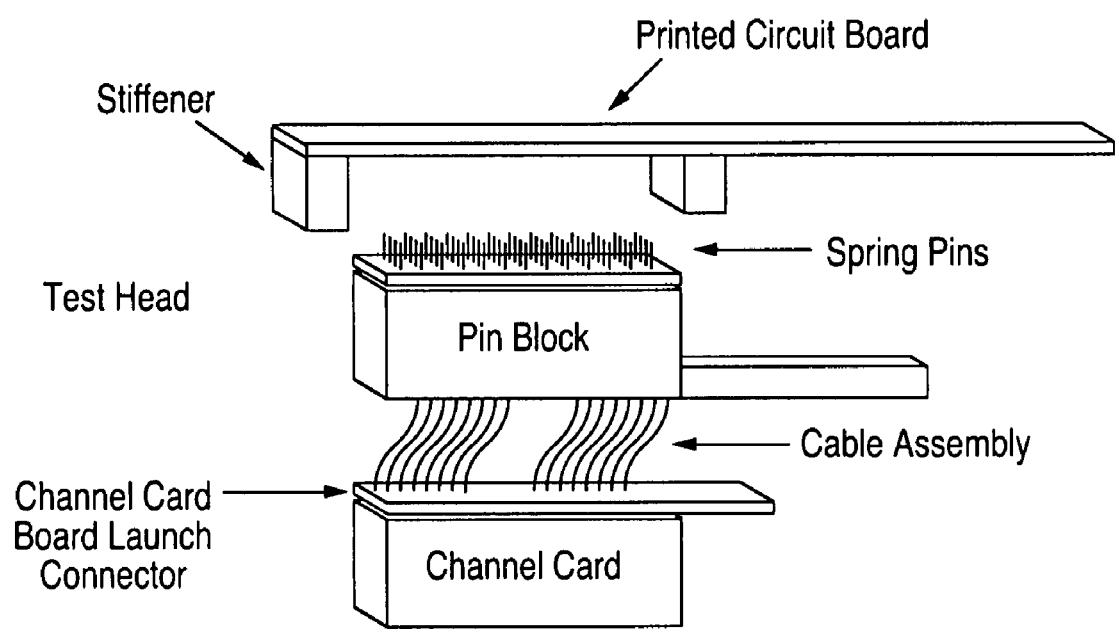
FIG. 4 shows tester resources coupled to a circuit board through an opening in a stiffener.

Described herein are techniques for improving circuit board stiffeners. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

FIGS. 5A and 5B show an example circuit board stiffener according to one embodiment of the present invention. In this example, the stiffener includes a lower piece 501 and an upper piece 503. The lower stiffener piece 501 includes a lower surface 530 for abutting an upper surface of a test system and an upper surface 531. The upper stiffener piece 503 includes a lower surface at 531 for abutting the upper surface of the lower stiffener piece 501 and an upper surface 532 for attaching to a circuit board 502. Upper stiffener piece is used to provide support for circuit board 502. The circuit board and upper stiffener piece may be attached or detached from the lower stiffener piece. Thus, the lower stiffener piece may remain on the tester, and a variety of circuit boards may be interchanged for different testing configurations. Additionally, because a large bulky part of the stiffener remains on the tester, the circuit board and upper stiffener are both lighter in weight and less bulky to store. Moreover, each circuit board need only have the upper stiffener attached. Since the upper stiffener likely costs less to manufacture than the lower stiffener, substantial cost savings can be achieved using embodiments of the present invention.

Figure 5C:
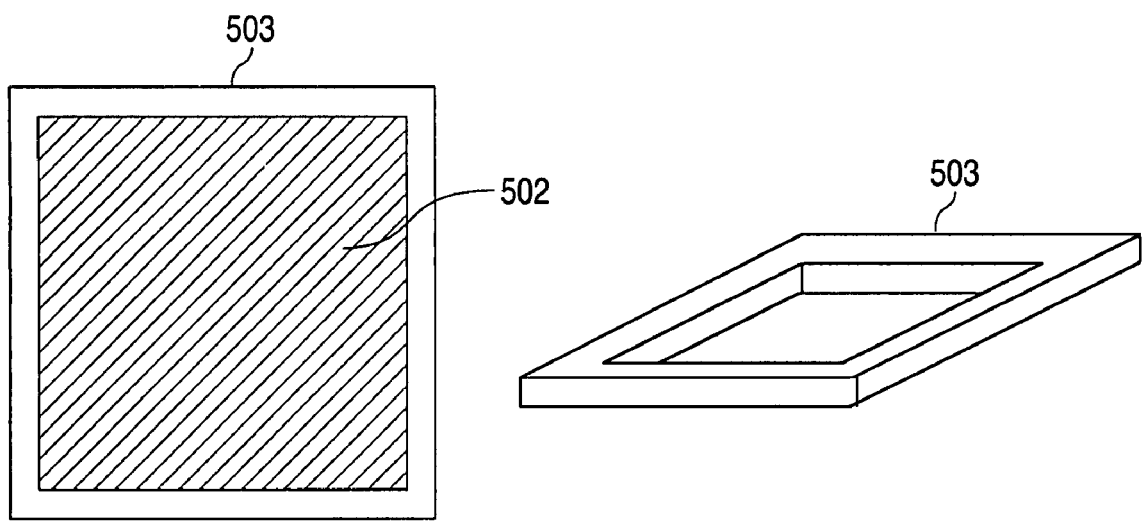

A variety of locking mechanisms may be used to attached and detach upper stiffener piece 503 to lower stiffener piece 501. In this example, the upper stiffener piece comprises a rigid peripheral frame 503 as shown in FIG. 5C. The rigid frame 503 is attached to circuit board 502 (e.g., using screws) and lower stiffener piece 501 includes one or more elbow pieces 504 attached to the stiffener. The elbow pieces perform the function of locking the upper stiffener piece to the lower stiffener piece in this example. The elbow piece(s) are configured so that the first upper surface 531 and the elbow piece(s) form one or more slots for receiving the circuit board and upper stiffener piece. In this example, the lower stiffener piece is square shaped. Thus, one elbow piece may be used to form a continuous slot around three sides of the lower stiffener piece, and the circuit board and attached upper stiffener piece may be inserted into the slot on the fourth side of the square. Alternatively, as shown in FIG. 5B, two sides of the square lower stiffener piece may include elbow pieces 504 along the entire length of the side and a rear transverse side may include a board stop 505. The circuit board and attached upper stiffener piece may be inserted on the fourth side and slide through the slot until reaching the board stop. It is to be understood that other slot arrangements may be used. Additionally, the shape of the lower stiffener and upper stiffeners may be a variety of shapes and sizes.

The lower stiffener piece may comprise a rigid peripheral frame, and may optionally further include one or more transverse beams. The peripheral frame of the lower stiffener piece includes a first outer sidewall defining an outer periphery and one or more inner sidewalls defining one or more vertical openings through said stiffener. As shown in FIG. 5C, the upper stiffener piece includes rigid peripheral frame configured to contact the rigid peripheral frame of the lower stiffener piece. Since the lower stiffener piece is for attaching to the tester, the lower stiffener piece 501 may include alignment mechanisms 512 as shown in this example. Alignment mechanisms will typically include alignment holes through the center for receiving alignment guides on the tester. In this example, the lower stiffener piece also includes handles 510A and 510B to facilitate carrying the lower stiffener piece when it is not attached to the tester.

FIGS. 6A and 6B show an example circuit board stiffener according to another embodiment of the present invention. In this example, the circuit board stiffener includes a lower stiffener piece 601 and an upper stiffener piece. The lower stiffener piece 601 may also comprise a rigid peripheral frame defining an outer periphery and openings through the stiffener, and may further include one or more transverse beams. The upper stiffener piece comprises a plurality of support rails 603A and 603B. The upper stiffener piece may optionally include a peripheral frame 650 as in FIG. 5. The support rails 603A-B and optional frame 650 may be attached to circuit board 602 to provide structural support. Lower stiffener piece 601 further comprises a plurality of grooves 604A-B. The support rails 603A-B and grooves 604A-B perform the function of locking the upper stiffener piece to the lower stiffener piece in this example. In this example, the support rails 603A-B and grooves 604A-B are aligned along transverse beams 660A-B. As shown in FIG. 6B, the support rails 603 may extend across the length of the circuit board to provide support across the entire board. Support rails 603 includes a continuous beam 651 and guides 603D that extend down into lower stiffener piece 601. The guides 603D may be interspaced along length of the circuit board. These guides are configured to engage the grooves 604 in lower transverse beams 660A-B. The upper stiffener piece may be aligned vertically above the lower stiffener piece so that the guides 603 may be lowered into alignment position. When the cross-sections of the support rails are aligned with the grooves, the upper stiffener piece may be moved horizontally so that the guides slide into and engage the grooves, thereby locking the lower and upper stiffener pieces together. The entire mechanism may be aligned to a tester using alignment holes 612 and attached using attachment bars 613. If the upper stiffener piece is removed from the lower stiffener piece, the upper piece may be easily manipulated and carried using handles 610.

Figure 7A:
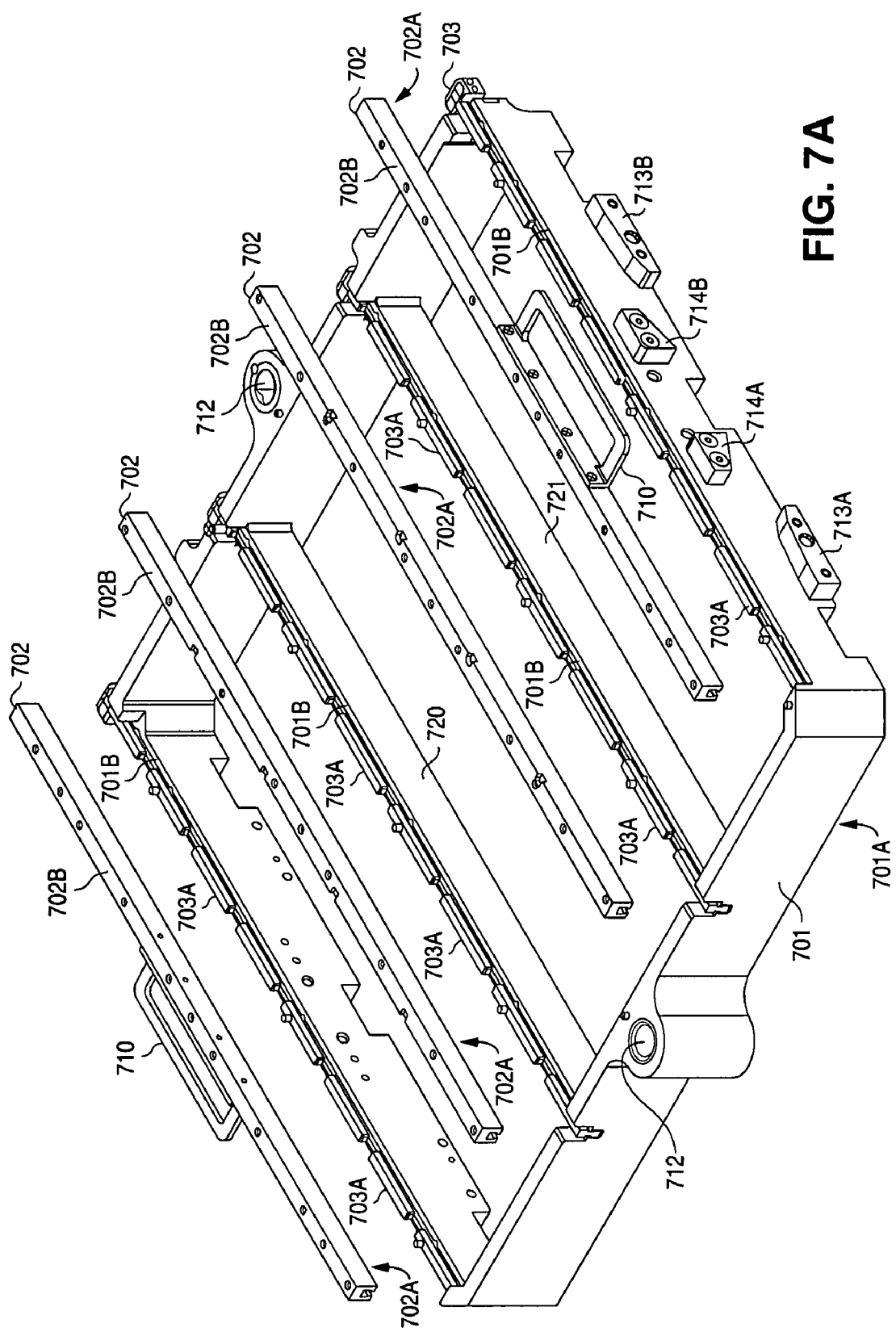
Figure 7B:
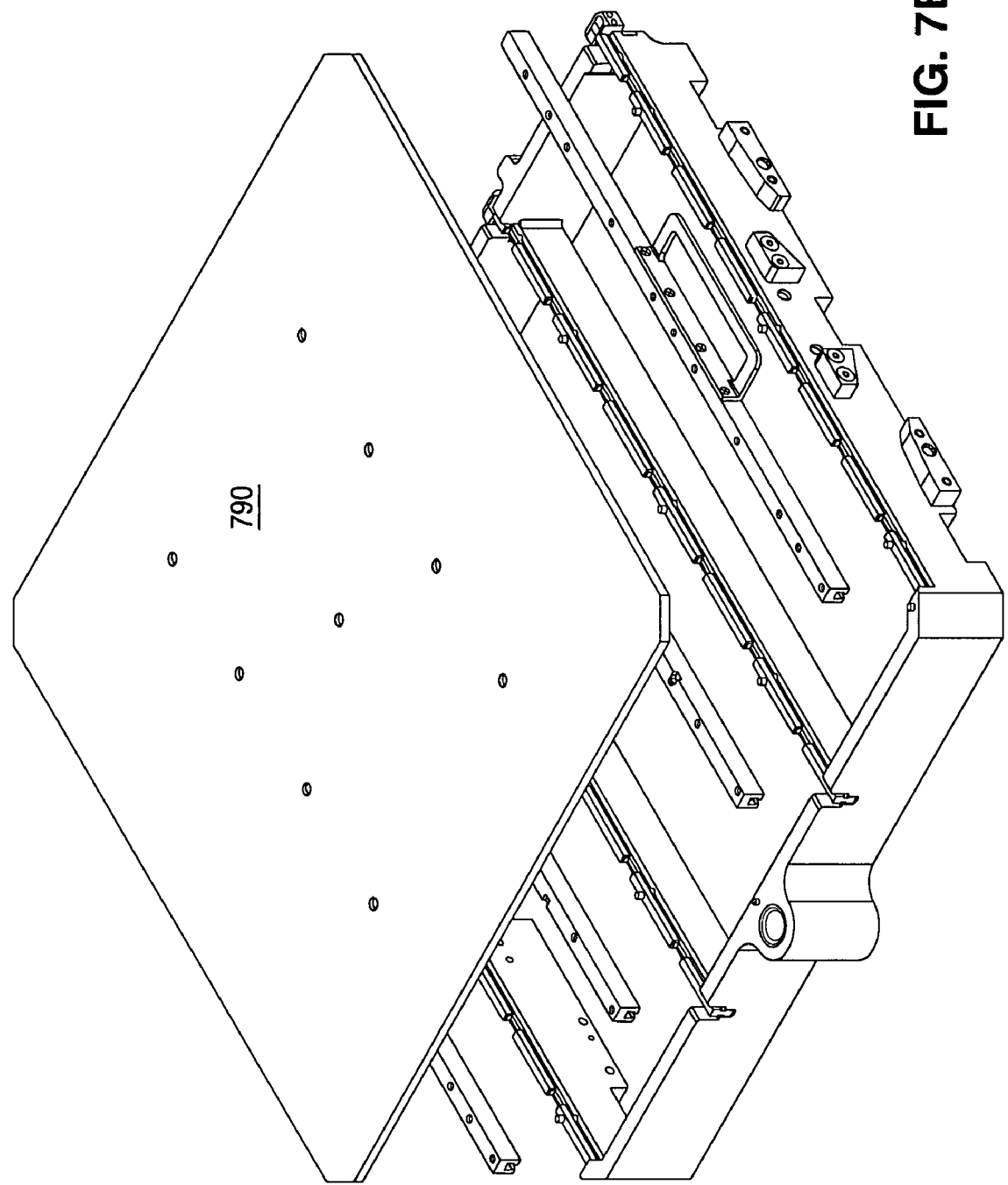

FIG. 7A shows an example circuit board stiffener according to another embodiment of the present invention. A first lower stiffener piece 701 includes a lower surface for abutting an upper surface of a test system (not shown), and a first upper surface 701B for abutting a lower surface of upper stiffener pieces 702. The upper stiffener pieces each have a lower surface 702A for abutting the upper surface 701B of the lower stiffener piece 701 and an upper surface 702B for attaching to a circuit board (not shown). FIG. 7B shows the stiffener of FIG. 7A with a circuit board 790. When the circuit board is attached to the upper stiffener pieces 702 and aligned to the lower stiffener piece 701, the lower surfaces 702A of the upper stiffener pieces will engaging the upper surfaces 701B of lower stiffener piece 701. In this example, lower stiffener piece also includes tester alignment holes 712 and attachment hardware 713A-B and 714A-B.

Furthermore, in this example the lower stiffener piece includes a rigid peripheral frame (a square or rectangle) and transverse beams 720 and 721. The peripheral frame of the lower stiffener piece includes a first outer sidewall defining an outer periphery and, together with transverse beams 720 and 721, inner sidewalls defining vertical openings through the stiffener. As shown in FIG. 7C, grooves 705 are provided in the upper surface 701B of lower stiffener piece 701. Referring again to FIG. 7A, locking rails 703 are inserted into each of the grooves 705. The locking rails 703 each include guides 703A having a particular geometric cross-section (e.g., a T cross-section). In this example, the upper stiffener pieces are transverse support rails that may engage the locking rails 703. In this example, the grooves 705, locking rails 703, and support rails 702 perform the function of locking the upper stiffener pieces to the lower stiffener piece.

Figure 8A:
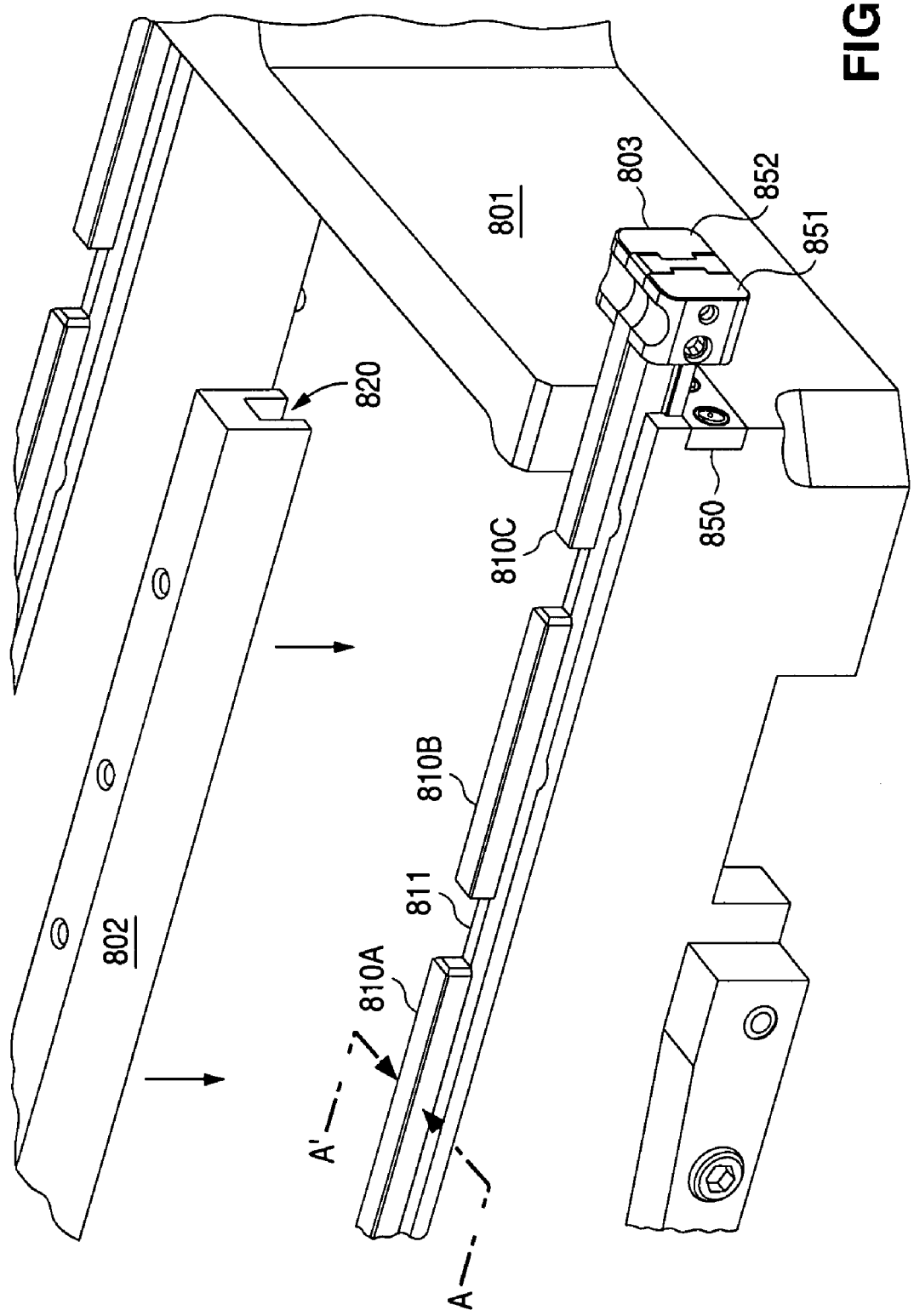
FIG. 8A is an example of a locking mechanism according to one embodiment of the present invention.

FIG. 8A is an example of a locking mechanism according to one embodiment of the present invention. A groove in lower stiffener piece 801 receives a locking rail 803. Locking rail 803 includes guides 810A-C spaced apart at regular intervals along the body 811 of the locking rail. Thus, the locking rail will have two differently shaped cross-sections. If the cross-section is taken at the guides 810A (i.e., across A and A', the geometry of the cross-section of the guide and the body will be a "T cross-section" shape because, in this example, the guides 810 are square guides and the body 811 of the rail includes a narrow vertical portion that intersects the square guides to form a "T-shape." However, it is to be understood that other geometric shapes could be used.

Figure 8B:
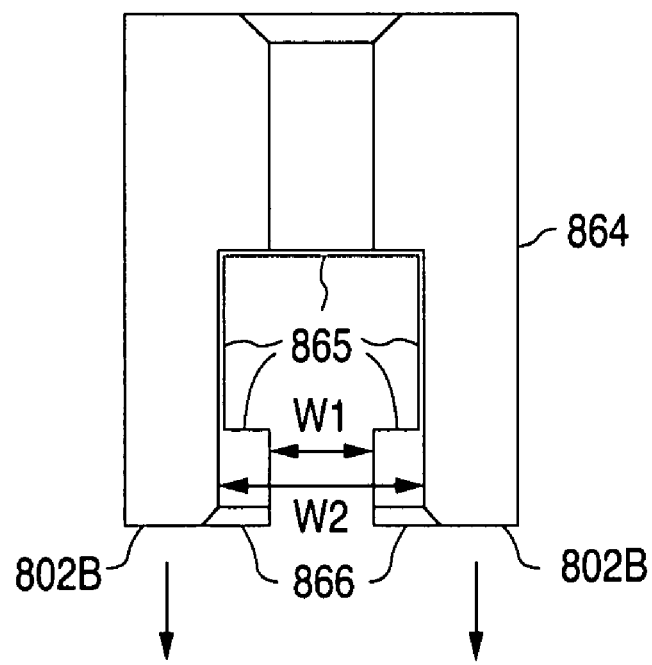
FIG. 8B shows a cross-section of a locking rail, stiffener, and support rail according to one embodiment of the present invention.
Figure 8B:
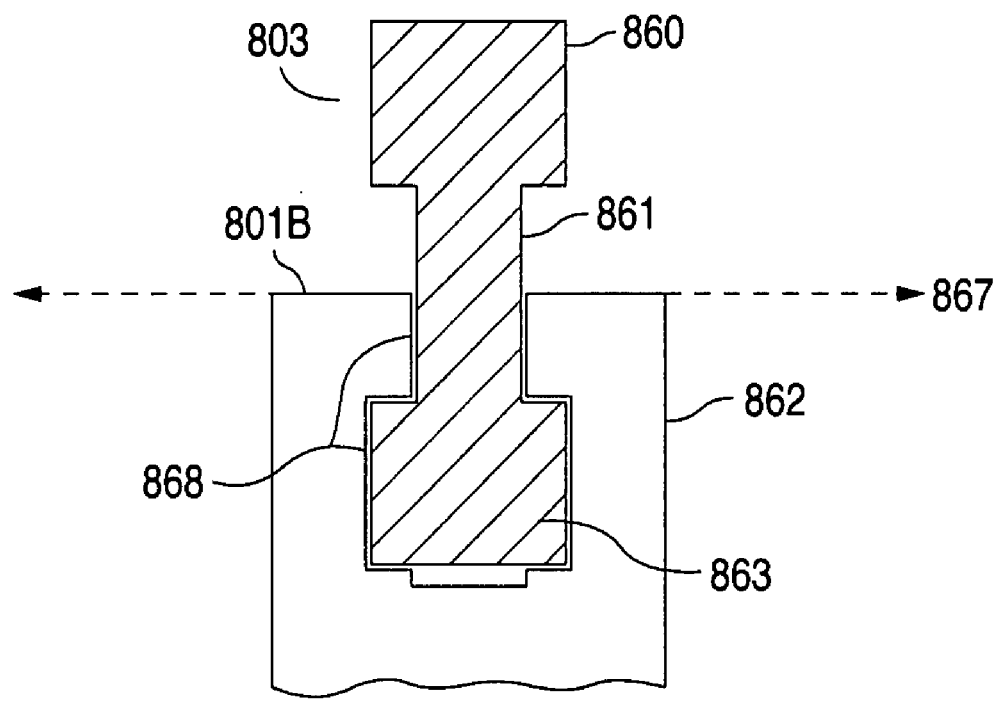

FIG. 8B shows a cross-section of a locking rail, lower stiffener piece, and support rail according to one embodiment of the present invention. Lower stiffener piece 862 includes a groove 868 for receiving the locking rail 803. In this example, locking rail 803 extends above the upper surface 801B of lower stiffener piece 862. The portion of the locking rail above upper surface 801B (i.e., above line 867) forms a "T cross-section." The upper portion of the rail includes a square guide 860. A portion 861 of the body of the rail extends above upper surface 801B and has a cross-section that is narrower than the cross-section of the square guide 860. The portion of the locking rail above upper surface 801B engages support rail 864. Support rail 864 includes a lower surface 802B for abutting upper surface 801B. In this example, support rail 864 includes a plurality of open regions having a first width "W2" and a plurality of semi-closed regions having a width "W1". In this example, the semi-closed regions include protruding stops 866 so that the sidewalls 865 of the semi-closed regions define cross-sectional openings in the shape of the "T cross-section" for engaging the square guides 860 of each locking rail. In this example, the lower stiffener piece 862 also includes a groove having sidewalls 868 for receiving and engaging the locking rail and locking the locking rail to the lower stiffener piece. In this example, the cross-section of the locking rail below the line 867 also forms a "T cross-section" so that the locking rail engages and locks to the groove in the lower stiffener piece. Thus, portions of the locking rail where the guides extend above the body of the rail will have a "Double-T" cross-section.

Figure 8C:
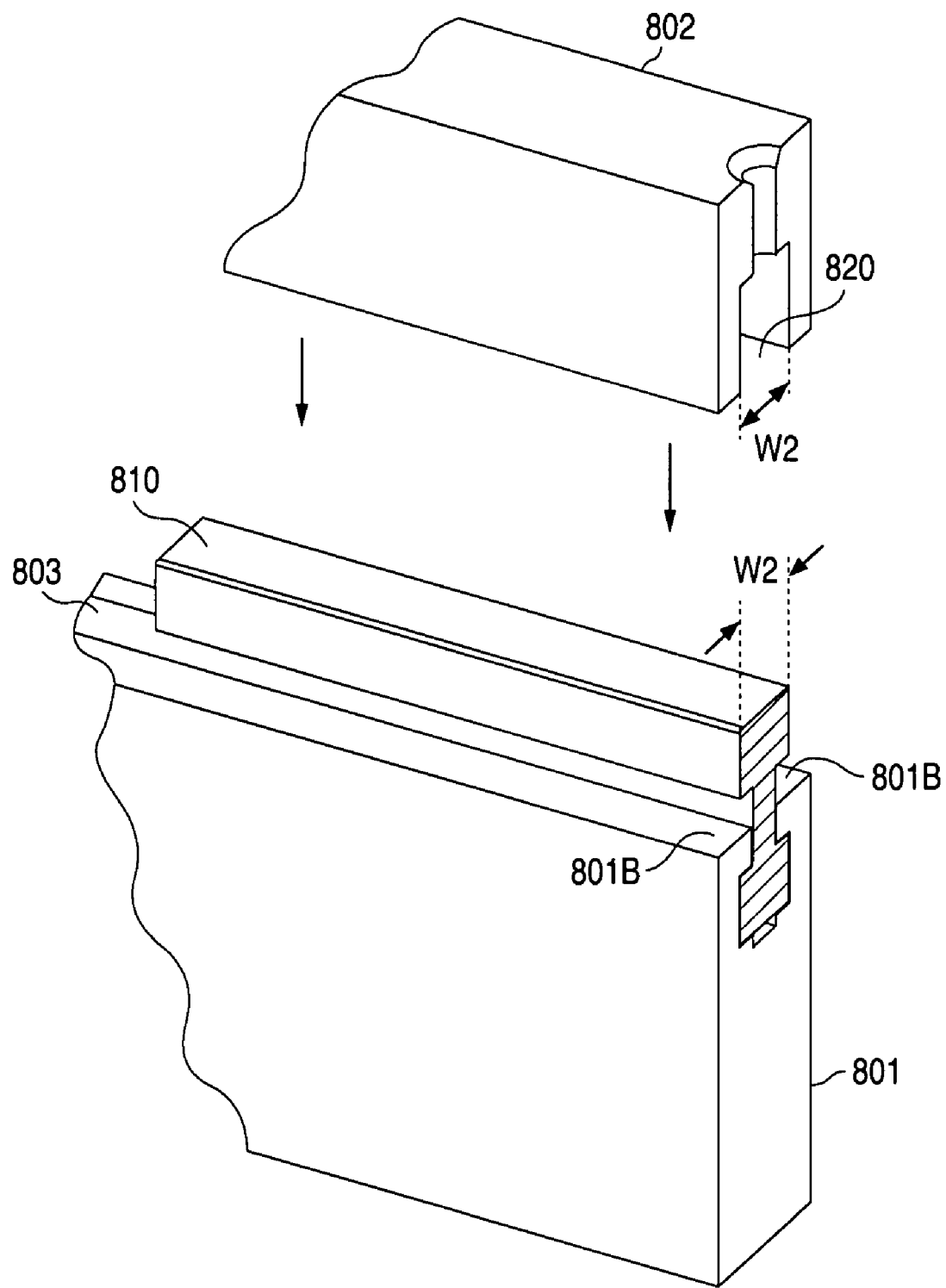
FIG. 8C is another example cross-section of a locking rail, lower stiffener piece, and support rail.

FIG. 8C another example cross-section of a locking rail, lower stiffener piece, and support rail. The support rail 802 includes a groove 820 having a width "W2". The width of guide 810 on locking rail 803 is also "W2". Thus, the guides 810 on locking rail 803 may fit vertically into groove 820 so that the support guides may be lowered to contact the upper surface 801B of lower stiffener piece 801.

Figure 9:
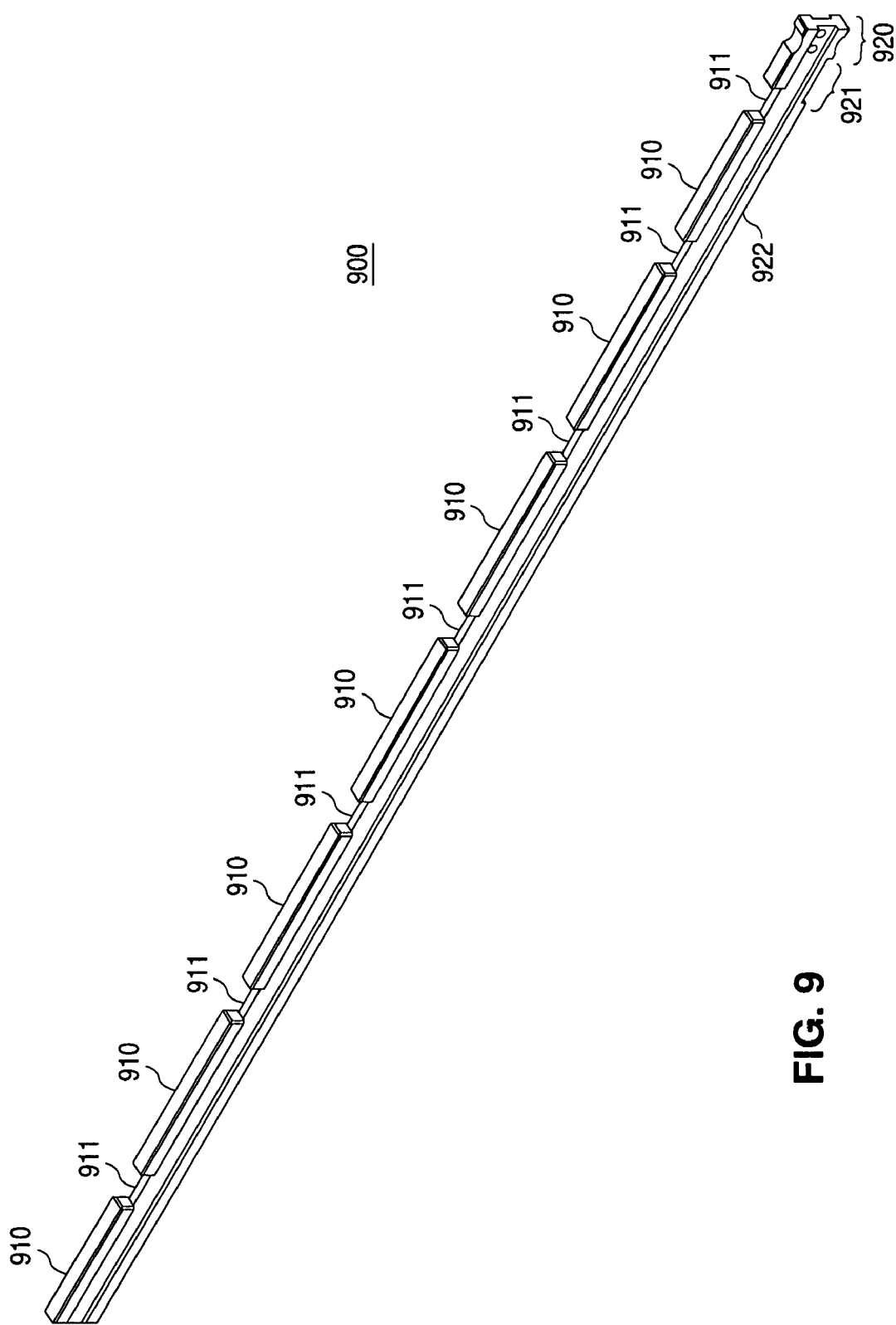
FIG. 9 is an example of a locking rail according to one embodiment of the present invention.

FIG. 9 is an example of a locking rail according to one embodiment of the present invention. Locking rail 900 may be manufactured from a single piece of material, and may include a body 911 having a first cross-section and guides 910, which in this case are square guides. The bottom of locking rail 900 includes a lower surface 922 that runs substantially the entire length of the rail. A handle portion 920 is provided at a first end of the rail 900. A recessed area 921 is provided between the lower surface 922 and handle 920. Referring to FIG. 8A, rail stop 850 is attached to the outer sidewall of lower stiffener piece 801 to control the range of lateral motion of locking rail 803.

Figure 10:
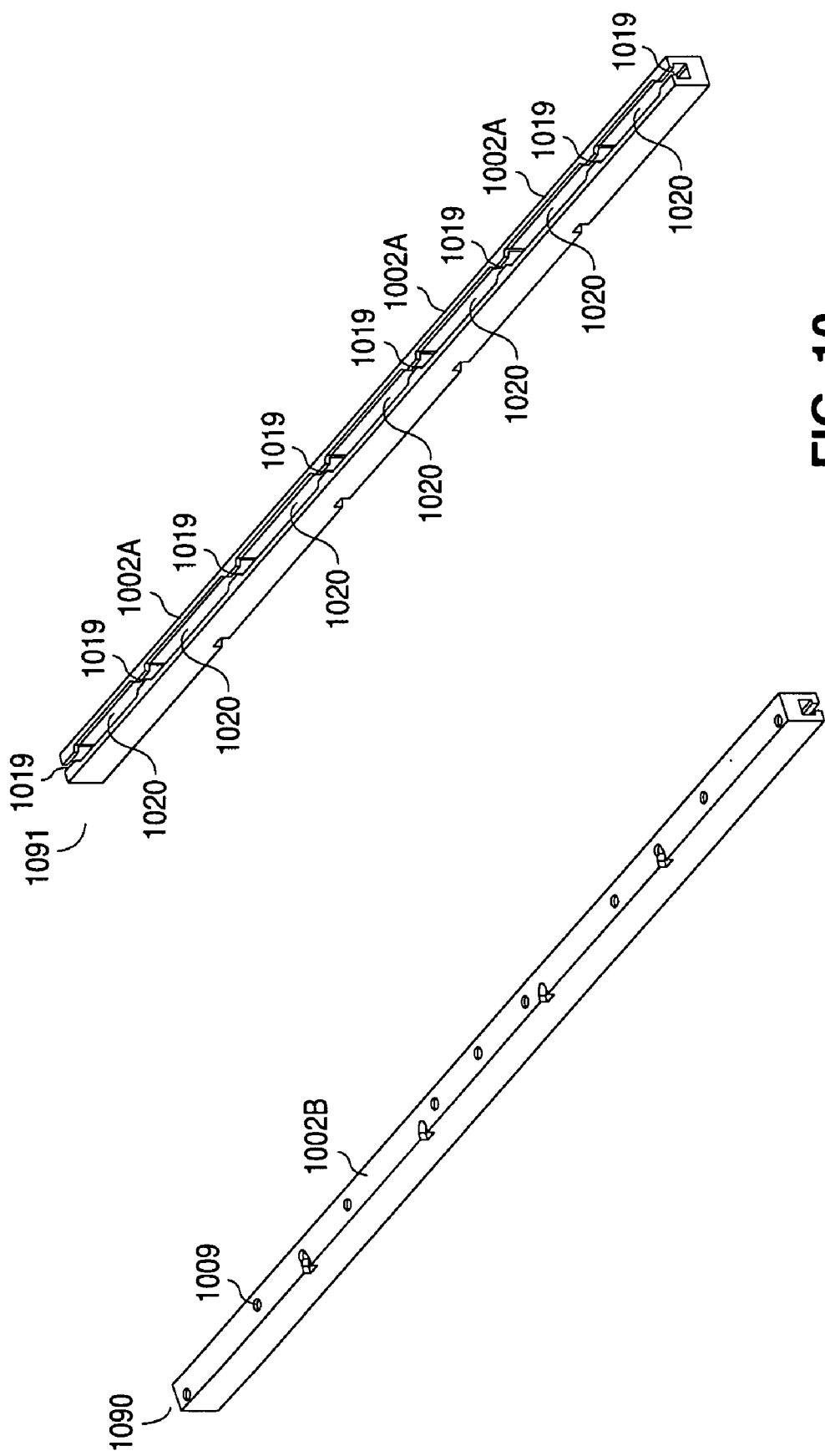
FIG. 10 is an example of a support rail according to one embodiment of the present invention.

FIG. 10 is an example of a support rail according to one embodiment of the present invention. FIG. 10 includes a view of both the upper surface 1002B of a support rail at 1090 and the lower surface 1002A of a support rail at 1091. In this example, upper surface 1002B includes a plurality of screw holes 1009 for attaching the support rail to a circuit board using screws. Lower surface 1002A includes a plurality of open regions 1020 between a plurality of semi-closed regions 1019. The open regions 1020 vertically receive the guides of a locking rail and the lower surface 1002A may be abutted to the upper surface of a lower stiffener piece. Then, the guides may be moved laterally so that the guides slide under the semi closed regions and the narrow body of the guide fits between the protruding stops of the semi-closed region and thereby lock the upper and lower stiffener pieces into place.

Figure 11:
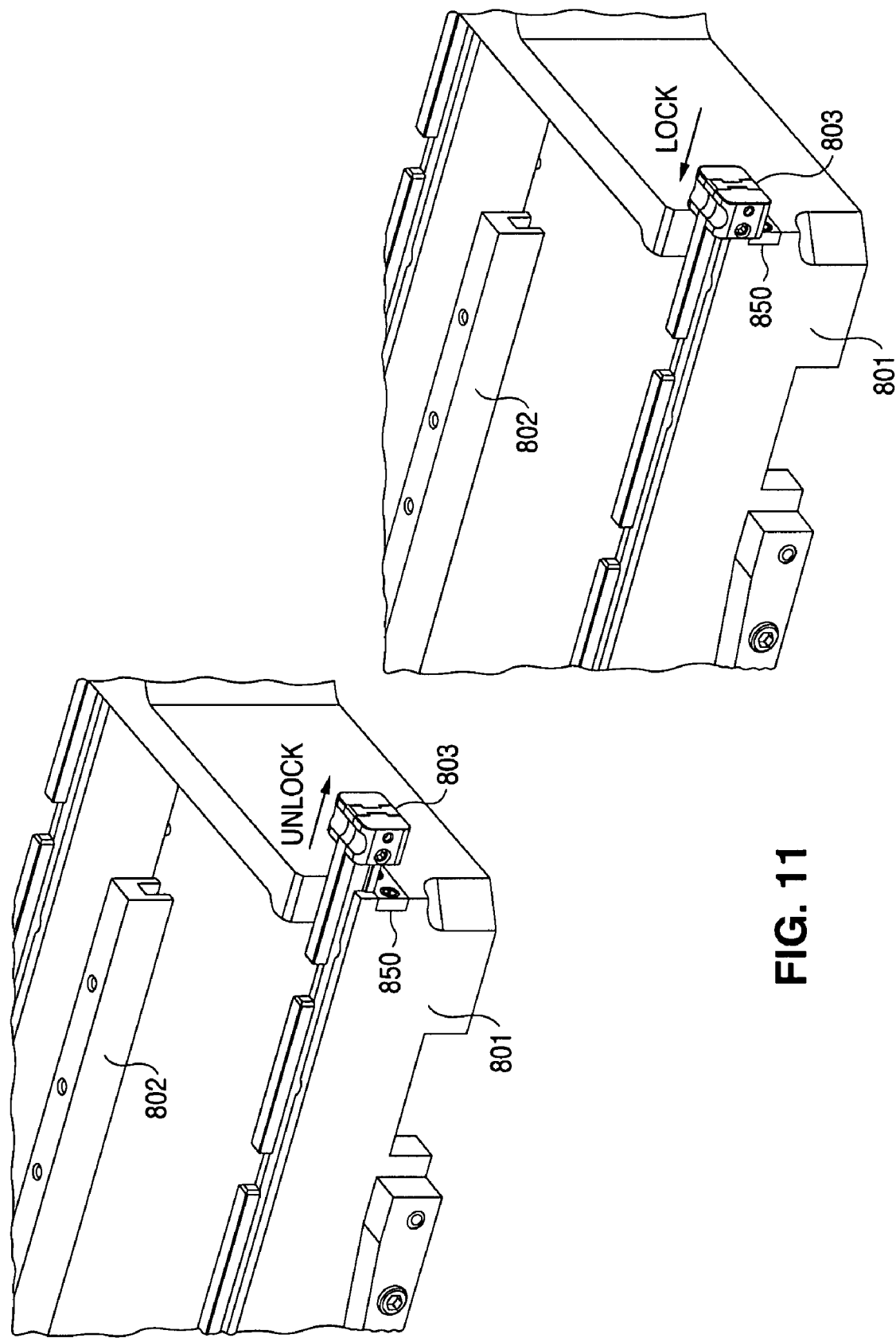
FIG. 11 further illustrates the locking mechanism in locked and unlocked positions.

FIG. 11 further illustrates the locking mechanism in locked and unlocked positions. As shown in FIG. 11, the locking rail may be moved laterally from an unlocked to locked position. When a circuit board is attached to a plurality of support rails 802, locking rails may be used to engage each support rail. The locking rails may initially be in an unlocked position, wherein the locking rail is pulled laterally out of the groove in the upper surface of the stiffener. In this position, the guides on the locking rail will align with the openings in the in each support guide 802, and the circuit board and support rails may be lowered so that the locking rail guides fit vertically into the openings. When the lower surface of the support rails and the upper surface of the lower stiffener piece make contact, the locking rails may be moved parallel to the circuit board into a locked position. In a locked position, the guides move laterally into the semi-closed regions and the upper and lower stiffener pieces are securely locked together. As mentioned above, the range of lateral motion of the locking rail may be controlled by the recessed area 921 (FIG. 9) in the body of the locking rail. A rail stop 850 may be attached to the outer sidewall of the lower stiffener so that it protrudes into the recessed area 921 of the locking rail. Since the rail stop protrudes into the recessed area 921, the locking rail may only move laterally along a distance defined by the recessed area 921. The recessed area 921 may be set so that when the locking rail is in the unlocked position (e.g., fully drawn out of the groove in the lower stiffener piece), the guides are aligned with the openings in the support rails, and when the locking rail is in the locked position (e.g., fully inserted into the groove in the lower stiffener piece).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims. In the following claims, certain elements in one or more claims for combinations are expressed as a "means for" performing a specified function. Such claims are to be construed to cover the corresponding structures described in the above specification and equivalents thereof. Claims that do not expressly use the words "means for" are to be construed broadly without being limited by the examples provided in the above disclosure.

What is claimed is:

1. A detachable two-piece circuit board stiffener comprising:
   a lower stiffener piece having a first lower surface for abutting an upper surface of a test system, and a first upper surface; and
   at least one upper stiffener piece having a second lower surface for abutting the first upper surface of the lower stiffener piece and a second upper surface, wherein a circuit board is attached to the upper stiffener piece,
   wherein the lower stiffener piece includes a plurality of grooves in the first upper surface and a plurality locking rails, wherein one locking rail is inserted into each of the grooves, and the at least one upper stiffener piece includes a plurality of transverse support rails configured to engage the plurality of locking rails in the lower stiffener piece.

2. The stiffener of claim 1 wherein the lower stiffener piece is locked to the at least one upper stiffener piece.

3. The stiffener of claim 1 wherein each locking rail includes a plurality of guides having a first geometric cross-section, and wherein each transverse support rail has a plurality of open regions between a plurality of semi-closed regions, wherein the sidewalls of the semi-closed regions define cross-sectional openings in the shape of the first geometric cross-section for engaging the guides of each locking rail.

4. The stiffener of claim 3 wherein each locking rail moves parallel to the first plane between a locked and unlocked position, wherein in the unlocked position the guides fit vertically into the open regions and in a locked position the guides move laterally into the semi-closed regions.

5. The stiffener of claim 1 wherein the lower stiffener piece includes a rigid peripheral frame.

6. The stiffener of claim 5 wherein the lower stiffener piece includes one or more transverse beams.

7. The stiffener of claim 5 wherein the rigid peripheral frame has a first outer sidewall defining an outer periphery and one or more inner sidewalls defining one or more vertical openings through said stiffener.

8. A detachable two-piece circuit board stiffener comprising:
   a lower stiffener piece having a rigid peripheral frame defining one or more openings through the stiffener, wherein the frame includes a first lower surface aligned to a test system and a first upper surface;
   at least one upper stiffener piece having a second upper surface and second lower surface, the second upper surface configured to attach to a circuit board, and in accordance therewith, the upper stiffener piece provides stiffening support for said circuit board; and
   a locking mechanism for locking the at least one upper stiffener piece to the lower stiffener piece, wherein when the locking mechanism is in a first horizontal position the upper stiffener piece is locked to the lower stiffener piece, wherein the locking mechanism comprises:
      a plurality of grooves in the first upper surface of the lower stiffener piece; and
      a plurality locking rails each having a plurality of guides having a first geometric cross-sections, wherein one locking rail is inserted into each of the grooves,
      wherein the at least one upper stiffener piece comprises a plurality of support rails, and wherein the second lower surface of each support rail has a plurality of open regions and a plurality of semi-closed region, and wherein the sidewalls of the semi-closed regions define cross-sectional openings in the shape of the first geometric cross-section for engaging the guides of each locking rail.

9. The stiffener of claim 8 wherein each locking rail moves parallel to said circuit board between a locked and unlocked position, wherein in the unlocked position the guides fit vertically into the open regions and in a locked position the guides move laterally into the semi-closed regions.

10. A detachable two-piece circuit board stiffener comprising:
    a lower stiffener piece having a rigid peripheral frame defining one or more openings through the stiffener, wherein the frame includes a first lower surface aligned to a test system and a first upper surface;
    at least one upper stiffener piece having a second upper surface and second lower surface, the second upper surface configured to attach to a circuit board, and in accordance therewith, the upper stiffener piece provides stiffening support for said circuit board; and
    locking means for locking the at least one upper stiffener piece to the lower stiffener piece, wherein when the locking means is in a first horizontal position the upper stiffener piece is locked to the lower stiffener piece, wherein the locking means comprises a plurality of grooves in the first upper surface and a plurality locking rails, wherein one locking rail is inserted into each of the grooves, and the at least one upper stiffener piece comprises a plurality of transverse support rails configured to engage the plurality of locking rails.

11. The stiffener of claim 10 wherein each locking rail includes a plurality of square guides having T-cross-sections, wherein each transverse support rail has a plurality of open regions between a plurality of semi-closed regions, and wherein the sidewalls of the semi-closed regions define a T-opening for engaging the square guides of each locking rail.

* * * * *